(12) United States Patent
Yoshizawa et al.

(10) Patent No.: US 8,129,273 B2
(45) Date of Patent: Mar. 6, 2012

(54) SEMICONDUCTOR DEVICE AND METHOD FOR PRODUCING THE SAME

(75) Inventors: Tetsuo Yoshizawa, Atsugi (JP); Shin-ichi Urakawa, Zama (JP); Takashi Miyake, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/881,616

(22) Filed: Sep. 14, 2010

(65) Prior Publication Data

US 2010/0330725 A1   Dec. 30, 2010

Related U.S. Application Data

(62) Division of application No. 12/061,097, filed on Apr. 2, 2008, now Pat. No. 7,821,121.

(30) Foreign Application Priority Data

Apr. 25, 2007   (JP) .................................. 2007-115616

(51) Int. Cl.
  *H01L 21/44* (2006.01)
(52) U.S. Cl. ........... 438/667; 438/668; 438/68; 438/110
(58) Field of Classification Search .................. 438/667, 438/668, 68, 110
  See application file for complete search history.

(56) References Cited

U.S. PATENT DOCUMENTS

| 5,729,437 | A  | 3/1998  | Hashimoto  | 361/760 |
| 6,187,243 | B1 | 2/2001  | Miyajima   | 264/272.15 |
| 6,601,295 | B2 | 8/2003  | Maekawa    | 29/841 |
| 6,815,249 | B2 | 11/2004 | Miura      | 438/65 |
| 7,482,701 | B2 * | 1/2009 | Ito et al. | 257/787 |
| RE41,478  | E *  | 8/2010 | Nakamura et al. | 257/777 |
| 2007/0181994 | A1 | 8/2007 | Fukase et al. | 257/700 |

FOREIGN PATENT DOCUMENTS

| JP | 2-035795    | 2/1990  |
| JP | 8-107161    | 4/1996  |
| JP | 9-181359    | 7/1997  |
| JP | 10-135492   | 5/1998  |
| JP | 11-74410    | 3/1999  |
| JP | 11-77734    | 3/1999  |
| JP | 2000-299335 | 10/2000 |
| JP | 2003-8077   | 1/2003  |

OTHER PUBLICATIONS

Office Action dated Sep. 16, 2011, issued in counterpart Japanese Application No. 2007-115616, and translation.

* cited by examiner

*Primary Examiner* — Thien F Tran
(74) *Attorney, Agent, or Firm* — Fitzpatrick, Cella, Harper & Scinto (57) ABSTRACT

In a semiconductor device which has through holes in an end face, in which a semiconductor element is fixedly mounted on a face of a substrate which has a wiring pattern, which is conductive to the wiring portion formed in the through hole, in at least one face, in which electrodes of the semiconductor element are electrically connected to the wiring pattern, and in which the face of the substrate which has the semiconductor element is coated with a resin, the through hole has a through hole land with a width of 0.02 mm or more, which is conductive to the wiring portion, in a substrate face, and the wiring portion and the through hole land are exposed.

4 Claims, 7 Drawing Sheets

SEMICONDUCTOR DEVICE AND METHOD FOR PRODUCING THE SAME

CROSS REFERENCE TO RELATED APPLICATION

This application is a division of U.S. application Ser. No. 12/061,097, filed on Apr. 2, 2008, the entire disclosure of which is hereby incorporated by reference herein.

BACKGROUND OF THE INVENTION

1. Field of the Invention

The present invention relates to a semiconductor device, which is constructed by coating with a resin a semiconductor element which is mounted on a substrate, and a method for producing the semiconductor device.

2. Description of the Related Art

Recently, information portable apparatus, such as a camera, a camcorder, a cellular phone, and a personal digital assistant, and information equipment, such as an LBP (Laser Beam Printer), an ink jet printer, and a copier, are requested for miniaturization, weight saving, thinning, and cost reduction. Also in semiconductor devices embedded into these, the same needs as mentioned have been growing very much. As a semiconductor device for achieving the above-mentioned requests, a semiconductor device, which does not have leads, such as a COB (Chip On Board) package and a leadless package, is publicly known.

Figure 4:
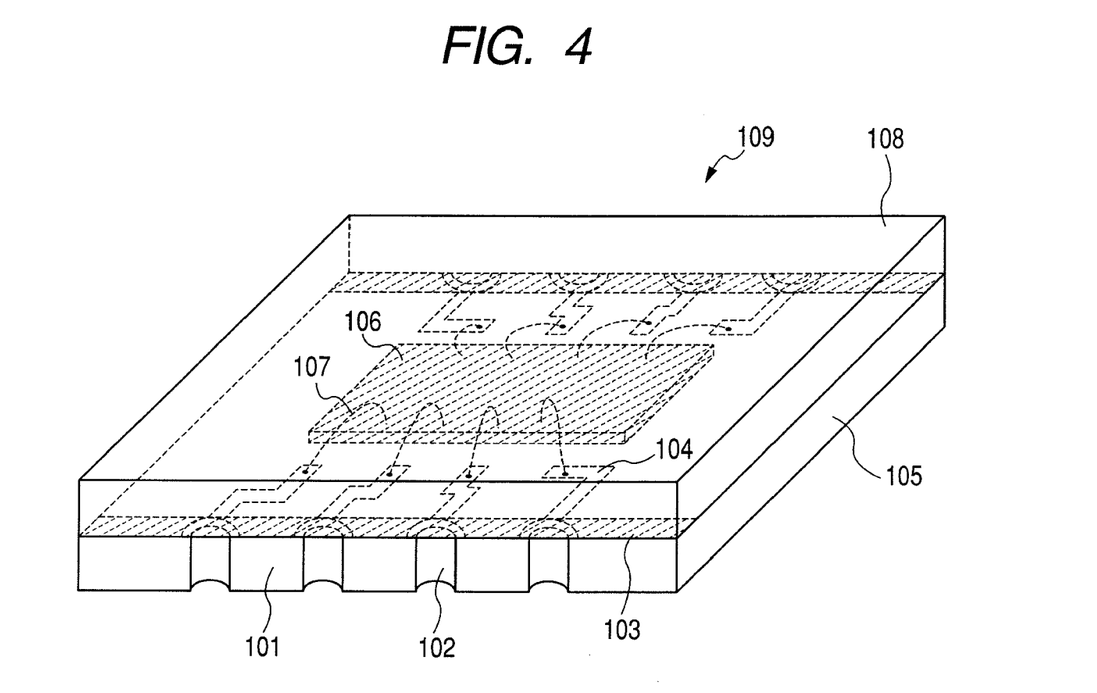
FIG. 4 is a schematic diagram illustrating a conventional semiconductor device that a semiconductor element is mounted on a substrate.

FIG. 4 is a schematic diagram illustrating a general conventional semiconductor device in which a semiconductor element is mounted on a substrate. A description will be performed according to FIG. 4.

An end face 101 has through holes 102, and not only a dry film 103 is laminated on the through holes 102 to block up the through holes 102, but also a semiconductor element 106 is fixedly mounted on a substrate 105 on which a wiring pattern 104 is formed. Next, the semiconductor device has structure as a semiconductor device 109 in which the semiconductor element, gold wires and connecting portions are entirely coated with a resin 108 after electrodes of the semiconductor element, and the wiring pattern 104 of the substrate 105 are electrically connected with gold wires 107.

As the substrate, there is a resin substrate, a metal substrate, a ceramic substrate, or the like. As the resin, generally, an epoxy resin and the like are used and a production method with high mass-productiveness, such as transfer molding and compression molding which use a molding, a dispenser method and a printing method, is used. When a semiconductor element is a photo sensor or a light emitting element, a light transmitting epoxy resin and the like are used.

In such a production method of the semiconductor device, in the case that patterns exist on both faces of a substrate and the substrate having both faces of which are made conductive with through holes is sealed with a liquid epoxy resin, a covering member (dry film or the like) on through holes may not be provided. In this case, the resin flows into the through holes and a malfunction arises in soldering in a post process. In particular, when a through hole, which provides in an end face of a semiconductor device, becomes an electrode for soldering to be performed with another circuit board, poor soldering may be generated in many cases because there is a sealing resin in the through hole. Hence, in a semiconductor device having construction of providing a through hole in an end face of a substrate and performing soldering in the end face, a device in which a sealing resin does not adhere to the through hole is necessary. As a unit to solve this problem, there is a unit which becomes public knowledge with Japanese Patent Application Laid-Open No. H08-107161 and Japanese Patent Application Laid-Open No. H10-135492.

In both electronic parts disclosed in the above-mentioned official gazettes, by covering through holes of each substrate with a covering member, such as a dry film, inflow of a liquid resin into the through hole is prevented.

In addition, in an electronic part described in Japanese Patent Application Laid-Open No. 2003-008077, by filling up a through hole interior with a liquid resist and curing the resist thereafter, a resin of a resin sealed body is prevented from permeating in the through hole.

Here, even when there is no sealing resin in a through hole of a semiconductor device, when a wiring portion of the through hole of the semiconductor device is soldered to another circuit board, soldering strength lacks without a through hole land. In addition, this causes a quality problem that a soldering inspection cannot be performed securely.

On the other hand, for resin sealing of a substrate in which a plurality of semiconductor elements is mounted lengthwise and crosswise, the transfer molding with high mass-productiveness is generally used as mentioned above to become public knowledge. Such methods are described in Japanese Patent Application Laid-Open No. H11-077734 and Japanese Patent Application Laid-Open No. 2000-299335.

A transfer molding method using a release film is described in the above-mentioned Japanese Patent Application Laid-Open No. H11-077734. In the above-mentioned Japanese Patent Application Laid-Open No. 2000-299335, a method of performing resin molding with pressing a position exposed to an external surface of a molded product with a release film is disclosed.

Furthermore, in an electronic part in Japanese Patent Application Laid-Open No. H11-074410 (refer to FIG. 12), although coating an electronic element on a substrate, a sealing resin is provided apart from through holes where upper surface electrodes are connected. In the production method, a molding covers a through hole line.

Nevertheless, since a covering member, such as a dry film, is used over through holes in the electronic parts in Japanese Patent Application Laid-Open No. H08-107161 and Japanese Patent Application Laid-Open No. H10-135492, cost increases because of an addition to a member and a process increase. In addition, in consideration of accurate adhesion and flashing of an adhesive for the dry film, it is necessary to secure a space for laminating the dry film, which is disadvantageous structure for miniaturization. Although a space of a member is not needed in the electronic part in Japanese Patent Application Laid-Open No. 2003-008077, since cost necessary for curing of a resist agent and cost necessary for etching are needed, it becomes expensive.

On the other hand, although a transfer molding method which is high in mass-productiveness is disclosed in Japanese Patent Application Laid-Open No. H11-077734, it is necessary to block up through holes, and hence, this cannot be also miniaturized and becomes expensive.

In addition, when soldering a wiring portion of through holes of the semiconductor device with another circuit board, poor soldering strength is caused, and it is not possible to inspect whether soldering is performed securely.

In Japanese Patent Application Laid-Open No. 2000-299335, although the method of performing resin molding with pressing a position exposed to an external surface of a molded product with a release film is disclosed, this does not arrived to an idea of prevention of inflow of a resin into a through hole.

Furthermore, in an electronic part in Japanese Patent Application Laid-Open No. H11-074410, through holes in a substrate are made into a face where a sealing resin does not flow. Nevertheless, it is not intended to achieve compatibility of an increase of soldering strength by suction of solder with facilitation of a visual inspection of whether soldering is performed properly.

SUMMARY OF THE INVENTION

A semiconductor device of the present invention aims at making solderability good, and increasing soldering strength by sucking of solder, when soldering a wiring portion of through holes of a semiconductor device with another circuit board. In addition, the semiconductor device of the present invention aims at inspecting easily whether soldering is performed securely.

In addition, a production method of the semiconductor device of the present invention aims at producing a semiconductor device in which through holes of a substrate are provided particularly in a face where a sealing resin does not flow, which is good in solderability as mentioned above, and which increases soldering strength and is easy in a soldering inspection.

In consequence of having repeated research and development wholeheartedly in order to solve the aforementioned problems, it was found out that the following semiconductor device and production method of the semiconductor device were optimum.

That is, the semiconductor device of the present invention is a semiconductor device which has through holes in an end face, in which a semiconductor element is fixedly mounted on a face of a rectangular substrate which has a wiring pattern, which is conductive to a wiring portion formed in the through hole, in at least one face, in which electrodes of the semiconductor element are electrically connected to the wiring pattern, and in which the face of the substrate which has the semiconductor element is coated with a resin, wherein the through holes have each through hole land with a width of 0.02 mm or more, which is conductive to the wiring portion, in the substrate face, and the wiring portion and the through hole land are exposed.

In addition, a method for producing the semiconductor device of the present invention is a production method of the semiconductor device which includes at least: a step of fixedly mounting a plurality of semiconductor elements in a face of a substrate, which has through holes and has a wiring pattern which is conductive to a wiring portion formed in the through holes in at least one face, lengthwise and crosswise, and inserting a set of semiconductor devices, in which electrodes of the semiconductor elements, and the wiring pattern of the substrate are electrically connected, between an upper molding and a lower molding which faces each other; a step of mold clamping the upper molding and the lower molding; a step of injecting a resin into each cavity of the above-mentioned upper molding and lower molding which contains the above-mentioned semiconductor element and curing the resin; a step of opening the molding and taking out the set of semiconductor devices which are sealed with the resin; and a step of cutting the through hole portion of the above-mentioned substrate to obtain individual semiconductor devices, wherein each of the through holes has a through hole land with a width of 0.02 mm or more, which is conductive to the wiring portion, in the substrate face, and that a convex portion of the above-mentioned upper molding or lower molding presses an area, including the width of the above-mentioned through hole land, or more to the above-mentioned through holes for the above-mentioned resin not to flow into the above-mentioned through holes during the injection of the resin.

In the semiconductor device of the present invention, the wiring portion and the through hole lands of the through holes of the substrate are exposed, and they are made into 0.02 mm or more-wide through hole lands. Thereby, it is possible to provide a semiconductor device which has good solderability at the time of soldering to another substrate, increases soldering strength by suction of solder, and facilitates an inspection of whether secure and proper soldering is performed.

In addition, since a remarkable resin flash prevention unit is not necessary, the production method of the semiconductor device of the present invention can provide a semiconductor device in miniaturization and low cost. Since through holes in a substrate is made into a face where a sealing resin does not flow, as described above, it is possible to provide the production method of a semiconductor device which has good solderability, increases soldering strength and is easy in a soldering inspection.

Further features of the present invention will become apparent from the following description of exemplary embodiments with reference to the attached drawings.

DESCRIPTION OF THE PREFERRED EMBODIMENTS

Hereinafter, construction of a semiconductor device, which is constructed by coating with a resin a semiconductor element mounted on a substrate, and a production method of the semiconductor device according to embodiments of the present invention will be described in detail in accordance with the accompanying drawings.

Summary of Embodiments

The essence of the production method of a semiconductor device of the present invention is to perform resin coating except a location in which through holes are provided by blocking up over the through holes of a substrate with a molding when arranging the substrate in the molding and performing molding by a resin.

Although a resin substrate, a metal substrate, and a ceramic substrate correspond as the substrate of the present invention, when inserting it between an upper molding and a lower molding and performing resin molding, a resin substrate and a metal substrate are suitable. In addition, the through hole of the present invention has a conductive member in a hole wall of the hole of a substrate by a method such as plating, and the hole is hollow. The hole is usually circular from a processing method. An approximately circular form is desirable although it does not always adhere to an accurate circular form.

The semiconductor device of the present invention is used as a semiconductor device which has through holes in a face (end face) of an end portion by cutting approximate centers of through holes of an aggregate substrate where a plurality of semiconductor elements is mounted.

When using the above-described production method, it is convenient to provide through hole lands. That is, it is possible to prevent that a resin permeates into the through holes from a gap between the molding and substrate. In addition, since a visual inspection of whether a soldering strength increases by a condition of solder suction and a soldering is properly performed on the occasion of soldering with another substrate becomes easy, it is more preferable. A through hole land is near a hole of a through hole of a substrate, it is a wiring pattern which is conductive to a wiring portion formed in the through hole, and it may be a circular form or an approximately ellipse form (U-shape) (this will be illustrated later in FIGS. 1A to 1I). Usually, the wiring pattern becomes convex to a base material of the substrate.

A characteristic of the present invention is to prevent resin permeating at the time of molding by pressing a through hole portion, and in particular, a through hole land of a substrate by a molding directly or through a release film. In order to prevent the resin flashing, it is necessary to hold down a through hole land by 0.02 mm or more including a through hole. Therefore, it is desirable to make a through hole land a width of 0.02 mm or more. When pressing it by less than 0.02 mm, it becomes easy to generate resin permeating. When pressure is enlarged so as to lessen resin flashing, buckling of a conductive member of a through hole arises. Therefore, it is necessary to select an optimum pressure in which the buckling of a conductive member of a through hole does not arise to prevent resin flashing. When a resin leaks and adheres to a through hole, when a semiconductor device is soldered to another substrate with solder or the like, solder hardly adheres or stops adhering to the through hole to become poor soldering, which becomes an important quality problem.

By the way, let a through hole diameter be A, let a distance between through hole lands be B, and let a through hole pitch (distance between adjacent through holes) be P as between through holes. In this case, a width X of a through hole land becomes P=A+B+2X and X=(P−A−B)/2.

In addition, it is desirable that a width of a through hole land is 5 mm or less in a direction orthogonal to an end face of a substrate. When the width of a through hole land is larger than this, solder flows at the time of soldering with another substrate, a proper amount of solder of a through hole is no longer kept, strength becomes insufficient, and soldering quality is not kept. In addition, a width of the wiring pattern which is conductive to a through hole land becomes narrower than a through hole land diameter (value obtained by adding twofold of the through hole land width to the through hole diameter A).

In this way, since a resin does not flow into each through hole, a semiconductor device, which has good quality and is inexpensive because a conductive member is exposed, and a production method of the semiconductor device are provided. In addition, since a 0.02 mm or more-wide through hole land is provided in each through hole and the each through hole land is exposed, when soldering is performed to another circuit board, solder is sucked from a wiring portion of a through hole to a through hole land. Hence, in comparison with a case that there is no through hole land, soldering strength increases and it is possible to inspect whether soldering is performed securely.

Although an epoxy resin is general as the resin to be used, a resin which is a resin sealing a semiconductor element and is publicly-known is sufficient. What is necessary is just to use an optically transparent resin, when a semiconductor element is a photoelectric transducer element. It is an acrylic resin, a silicone resin, a polycarbonate resin, each modified resin of these resins, or the like besides an epoxy resin. As the photoelectric transducer element, image sensor elements such as a CCD or a CMOS element, a photo sensor for AE (Auto Exposure), AF (Auto Focus), or the like, or a light emitting element, or the like is cited.

First Embodiment

A first embodiment of the present invention will be described using FIGS. 1A to 1I which are perspective views or sectional views for sequentially describing the essence of production process which shows the first embodiment.

Figure 1A:
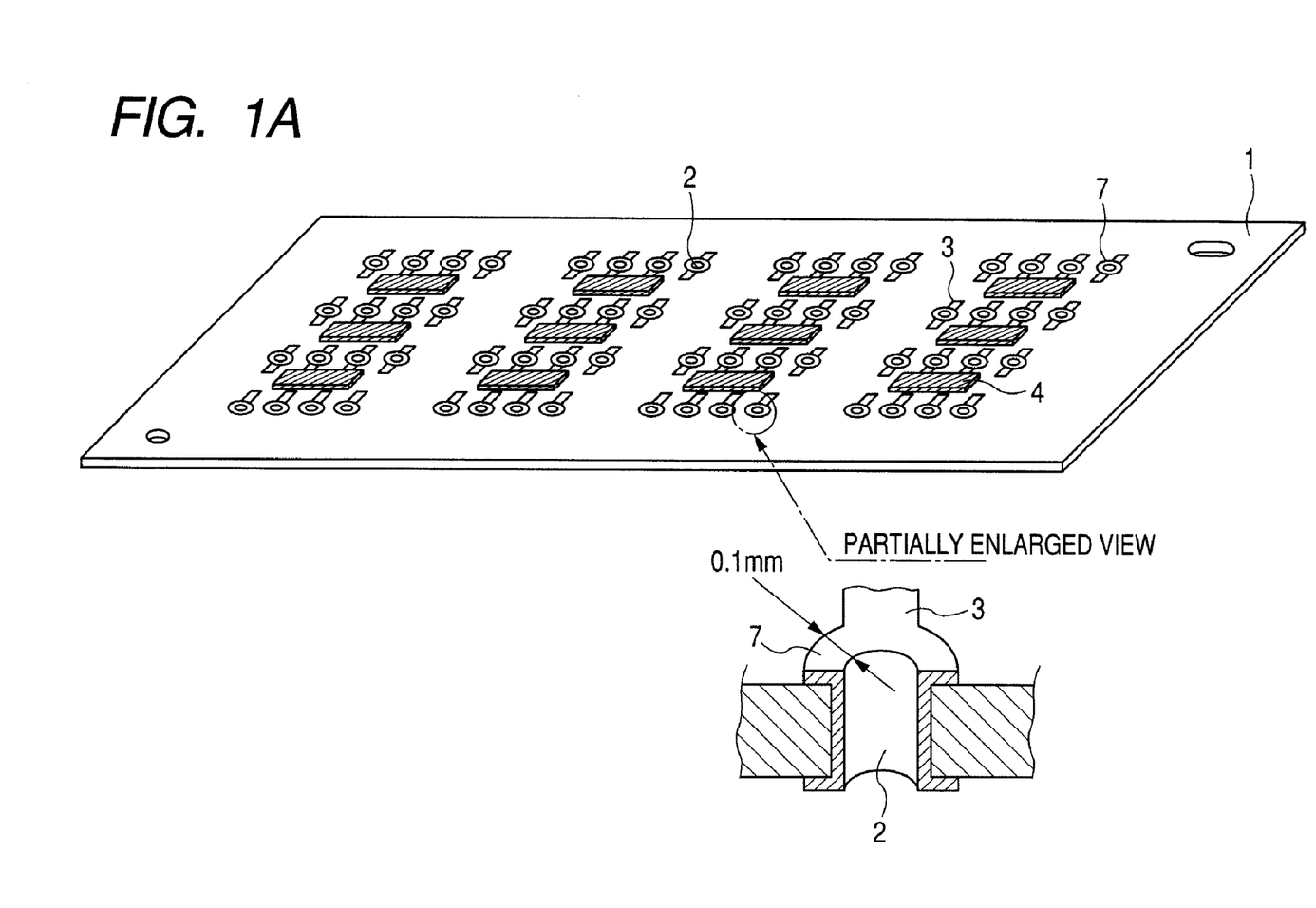
FIG. 1A is a perspective view of a substrate on which semiconductor elements are fixedly mounted among states in production process of a semiconductor device in a first embodiment of the present invention.
Figure 1B:
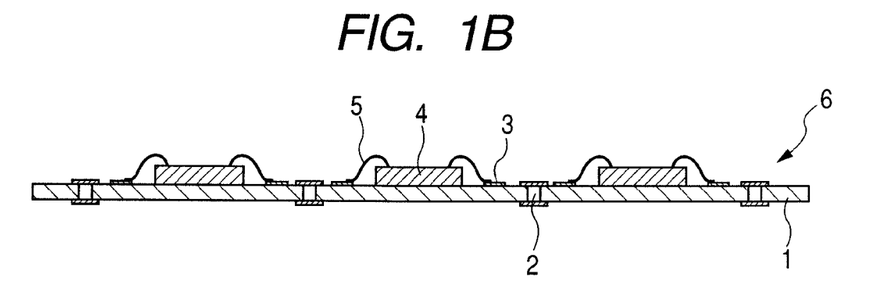
FIG. 1B is a sectional view viewing FIG. 1A from the right toward the drawing.

FIG. 1A is a perspective view of a substrate on which a semiconductor element used for the first embodiment is fixedly mounted. FIG. 1B is a sectional view viewing FIG. 1A from the right toward the drawing. In addition, so as to understand further a through hole portion, an enlarged view of a section of the through hole portion is drawn.

A substrate 1 (in FIG. 1A, a substrate before cutting) is a substrate made from a glass epoxy resin, and it has through holes 2 lengthwise and crosswise and a wiring pattern 3 which is conductive to the through holes 2. A through hole pitch (distance between adjacent through holes) is 0.7 mm, a through hole diameter is 0.3 mm, and a width of a through hole land 7 is 0.1 mm (see the enlarged view). The wiring pattern 3 and through holes 2 are nickel plated on copper, and gold plating is given on the nickel plating. A plurality of semiconductor elements 4 mounted lengthwise and crosswise on the substrate 1 is die-bonded and fixed. The semiconductor elements are photo sensors. After that, electrodes of the semiconductor elements 4 and the wiring pattern 3 are wire bonded using gold wires (5 in FIG. 1B) and are electrically connected. What is wire bonded becomes a semiconductor member 6 which is a set of semiconductor devices.

Figure 1C:
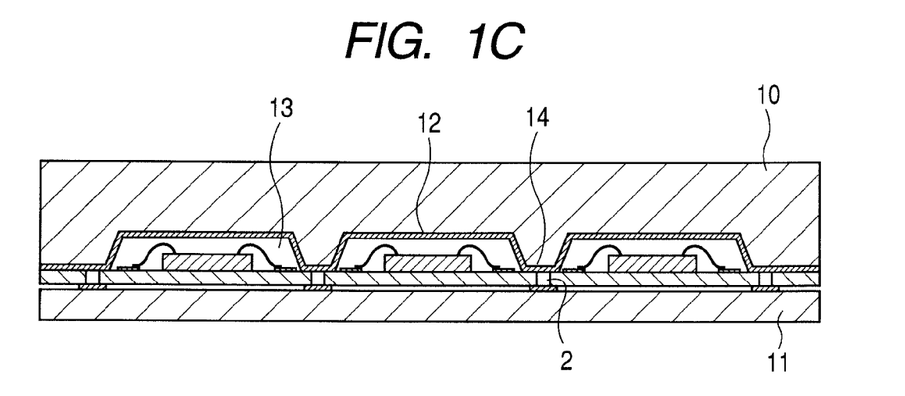
FIG. 1C is a sectional view after inserting a semiconductor member 6 between upper and lower moldings and performing mold clamping.

FIGS. 1C to 1I are sectional views or perspective views of semiconductor members and semiconductor devices illustrating an assembly procedure. FIG. 1C is a sectional view after inserting the semiconductor member 6, obtained in FIG. 1B, between an upper molding 10 and an lower molding 11 which face each other, and performing mold clamping after that.

Here, a release film 12 is sucked by (not illustrated) and is stuck to the upper molding by a publicly-known method. Each through hole 2 of the substrate is pressed with the upper molding 10 and the lower molding 11 through the release film 12. A cavity 13 of the upper molding contains four semiconductor elements, vertically located in a line toward a paper face of the figure, to be constructed as one cavity, and in the case of this embodiment, the molding has a total of three cavities. The each through hole 2 of the substrate is pressed by a 1 mm convex portion 14 in the upper molding. The release film 12 is a fluorine film, and its thickness is 0.05 mm. The each convex portion 14 of the upper molding presses an area, including a width of a through hole land, or more to the through hole concerned for a resin so as not to flow into the through hole.

Figure 1D:
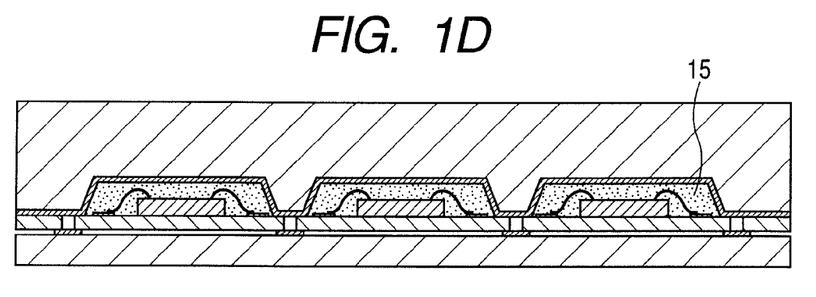
FIG. 1D is a sectional view after injecting a resin 15 into cavities 13 and curing the resin by a transfer molding method.

FIG. 1D is a sectional view after injecting a resin 15 into cavities and curing the resin by a transfer molding method. As the resin 15, a light transmitting epoxy resin is used. An injection direction of the resin is a direction perpendicular to a paper face.

Figure 1E:
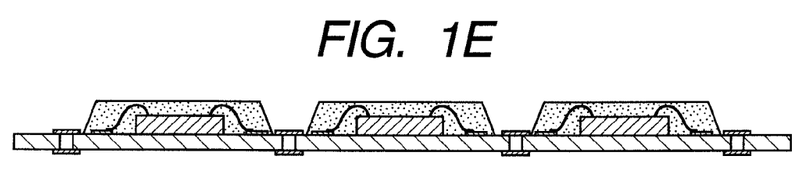
FIG. 1E is a sectional view of the semiconductor device at the time when the molding is opened and the semiconductor device is taken out.

FIG. 1E is a sectional view of the semiconductor device at the time when the molding is opened in FIG. 1D and the semiconductor device is taken out. An upper face of the resin which covers each semiconductor element is flat.

Figure 1F:
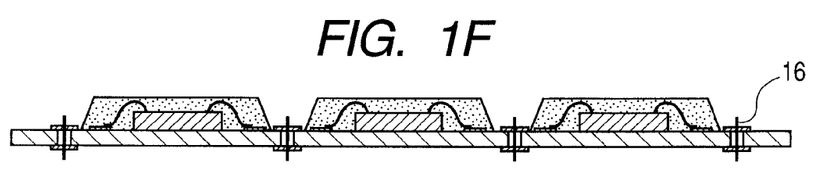
FIG. 1F is a sectional view in the case of cutting the semiconductor device in centers 16 of through holes.

FIG. 1F is a sectional view in the case of cutting the semiconductor device, obtained in FIG. 1E, in centers 16 of through holes; it is cut with a cutting method using a dicing saw.

Figure 1G:
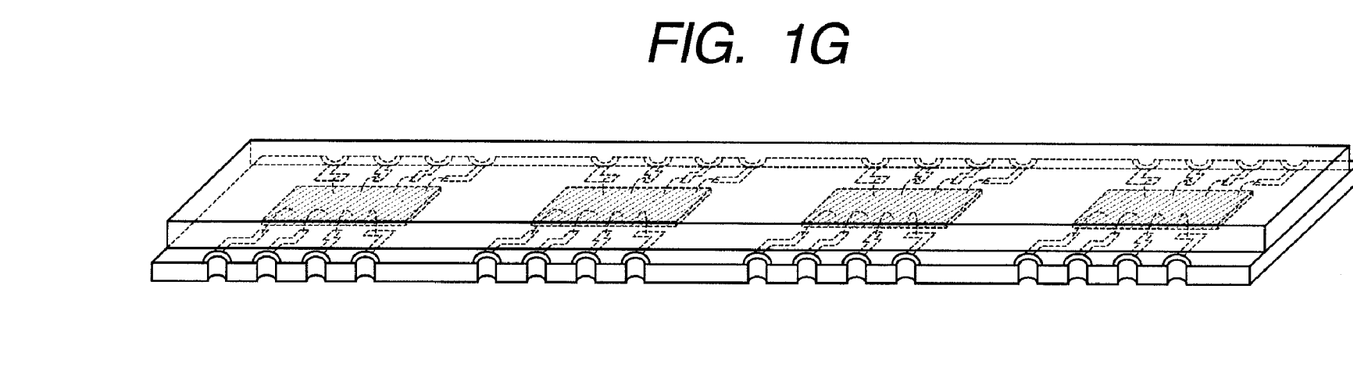
FIG. 1G is a perspective view of the semiconductor device in FIG. 1F.
Figure 1H:
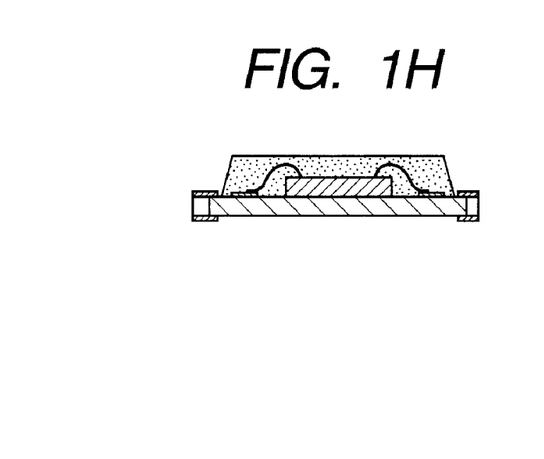
FIG. 1H is a sectional view of the semiconductor device at the time when the semiconductor device is divided into four pieces.
Figure 1I:
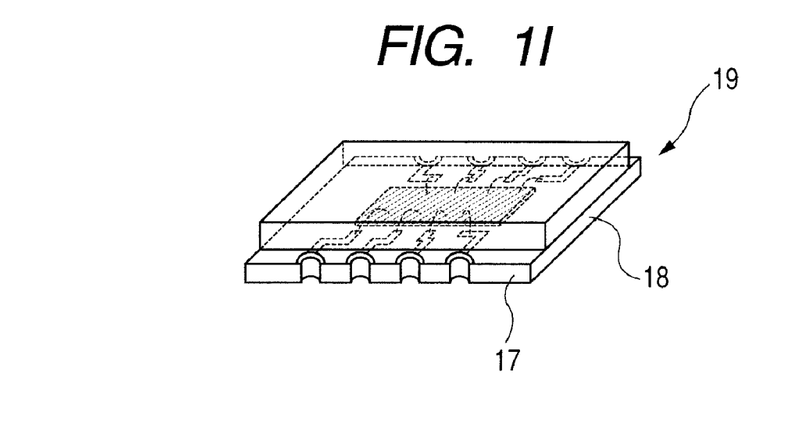
FIG. 1I is a perspective view of the semiconductor device in FIG. 1H.

FIG. 1G is a perspective view of the semiconductor device in FIG. 1F. FIG. 1H is a sectional view of a semiconductor device which is obtained by dividing the semiconductor device in FIG. 1G into four pieces using the same dicing saw. It becomes an individual semiconductor device. FIG. 1I is a perspective view of the semiconductor device in FIG. 1H. FIGS. 1H and 1I illustrate an embodiment of the semiconductor device of the present invention. Through holes are located in one end face 17 of a rectangular substrate of a semiconductor device 19, and a wiring portion and through hole lands are exposed. Each end face of the resin 15 is flush with each other end face 18 of the substrate.

In this embodiment, although a resin substrate is used as a substrate, a through hole pitch is 0.7 mm, and a through hole diameter is 0.3 mm, any may be sufficient, and, although the resin substrate is used as the substrate, a metal substrate may be sufficient as it. In addition, in this embodiment, although a light transmitting epoxy resin is used since a photo sensor is used as a semiconductor element, when it is not an optical sensor, a publicly-known black resin may be used without using an optically transparent resin. In that case, without using wire bonding using a gold wire, connection may be performed with a method of producing respective bumps on electrodes of the semiconductor element, and connecting the bumps to the substrate, that is, a so-called flip chip method. Although a transfer molding method is used in this embodiment, a compression molding method may be used. According to this embodiment, although a release film is used at the time of molding, it is sufficient without using it to perform process setting in consideration of resin flashing and buckling. In addition, although being 1 mm in this embodiment, a holding-down width of the through holes may be 0.5 mm which is a sum of the through hole diameter of 0.3 mm, which is a minimum width, and twofold of the through hole land width of 0.1 mm.

The semiconductor device obtained by this embodiment could be produced inexpensively, and its quality was also favorable. Also in the result of soldering the semiconductor device of the present invention to a mother board, soldering characteristics, and in particular, soldering strength was enough, it was easy to inspect whether soldering was performed securely, and quality was also favorable.

Since a mold release agent was coated on a molding in a conventional transfer molding method, non-uniformity of coating arises, and dispersion in quality arises since frequent coating is necessary, which led to high cost. In addition, it was high cost although there was also a method of performing releasing treatment to a molding. In this embodiment, a release film was used in order to improve releasability from a molding. A film which is released easily from a resin is cited as the release film. Specifically, although PTFE, ETFE, other films made of fluorine, a silicone film, and the like are cited, any kind of film may be sufficient so long as mold release can be obtained, and films made by stacking the above-mentioned films on other materials may be sufficient. A thickness can be selected from in a range of 1 to 500 micrometers. In addition, the above-mentioned buckling problem of through holes is also solvable by selecting a modulus of elasticity of a release film. Furthermore, by selecting surface roughness Ra of a release film, surface roughness of a resin is easily controllable.

In addition, in the production method of a semiconductor device of the present invention, coating of a mold release agent to a molding is unnecessary, and remarkable treatment to through holes of a substrate is also unnecessary. Furthermore, by selecting a modulus of elasticity of a release film, it is possible to provide the desired production method of a semiconductor device, which has no problems, such as buckling to through holes, and is in high quality and low cost.

An advantageous effect of a semiconductor device obtained by such production method of a semiconductor device becomes remarkable in a resin with low viscosity and long flow property like an optically transparent resin.

Second Embodiment

Figure 2A:
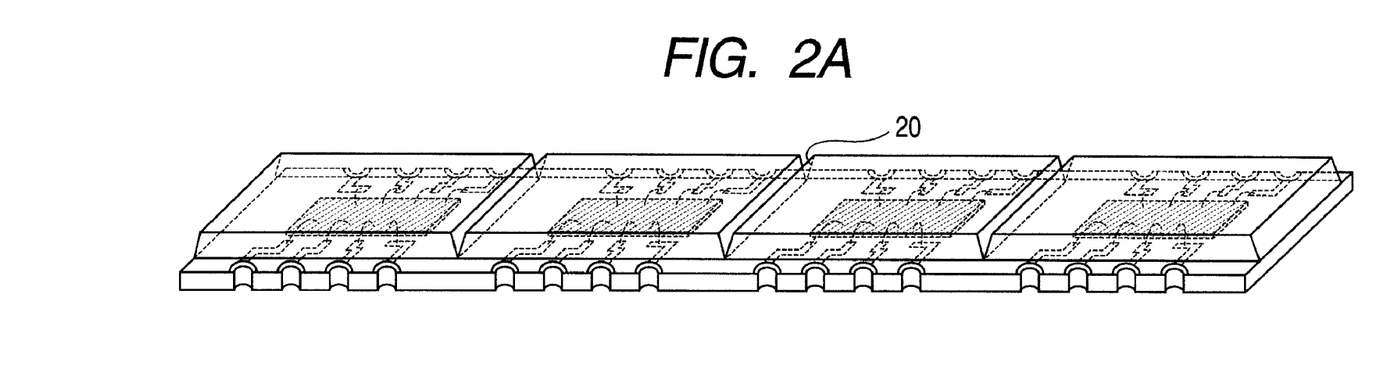
FIG. 2A is a perspective view illustrating a state of a semiconductor device in production process in a second embodiment of the present invention.
Figure 2B:
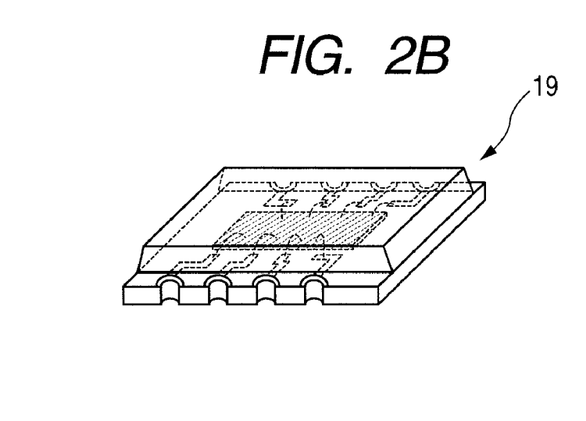
FIG. 2B is a perspective view of the semiconductor device.

A second embodiment is illustrated in FIGS. 2A and 2B. FIG. 2A is a perspective view of a semiconductor device on the way of production, and FIG. 2B is a perspective view of the semiconductor device.

Cavity forms of moldings for transfer molding are different from the first embodiment in this embodiment. In the first embodiment, cavities becomes plural lines, spaces communicates mutually in one line of cavities, which correspond to a plurality of semiconductor elements. In this embodiment, a plurality of cavities is arranged serially and formed so as to contact mutually in one line of cavities, and to have gates in their interfaces of each cavities. A resin is injected from the gates, and the resin is sequentially injected from each of the gates to each of the plurality of cavities.

That is, a cavity form of the molding is one corresponding to an individual semiconductor element, and cavities of adjacent semiconductor elements overlap mutually. In other words, the first embodiment adopts a form where cavities are continuous and there is no gate seemingly, and this embodiment adopts a form where there is a gate seemingly between cavities. Each interface between overlapping cavities becomes a gate 20.

A width between adjacent gates 20 becomes approximately a resin width of a semiconductor device, and a gate height can be set arbitrarily. The semiconductor device obtained in FIG. 2A is cut in each of gates 20 to become semiconductor devices 19. The semiconductor devices obtained by this embodiment could be produced inexpensively, and their quality was also favorable.

Third Embodiment

Figure 3A:
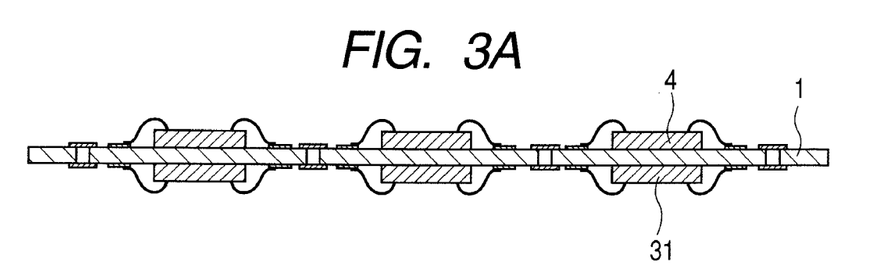
FIG. 3A is a sectional view of a substrate on which semiconductor elements are fixedly mounted among states in production process of a semiconductor device in a third embodiment of the present invention.
Figure 3B:
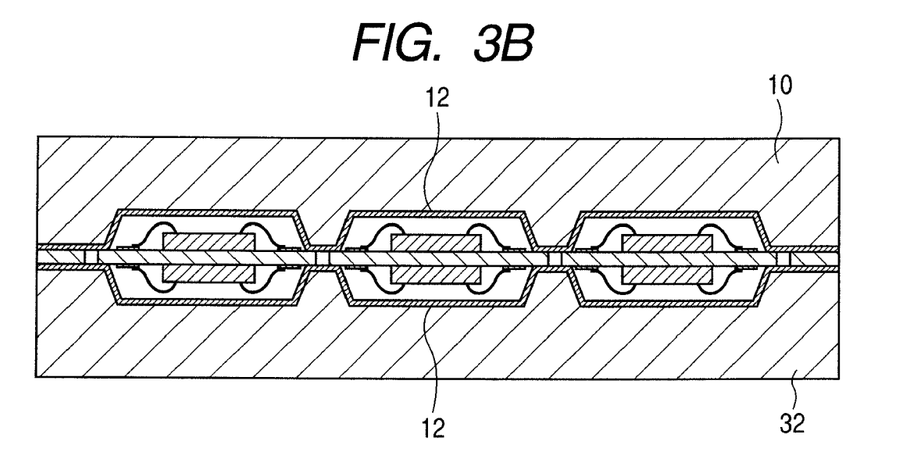
FIG. 3B is a sectional view after inserting a semiconductor member 6 between upper and lower moldings and performing mold clamping.
Figure 3C:
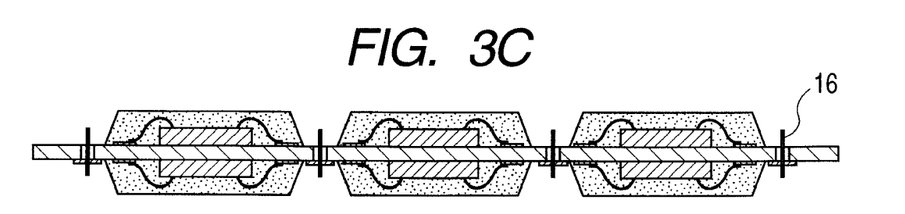
FIG. 3C is a sectional view in the case of cutting the semiconductor device in centers 16 of through holes.
Figure 3D:
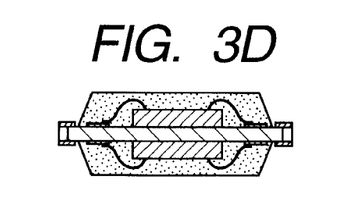
FIG. 3D is a sectional view of the semiconductor device.

A third embodiment is illustrated in FIGS. 3A to 3D. FIGS. 3A to 3C are sectional views of a semiconductor member and semiconductor devices on the way of production, and FIG. 3D is a sectional view of a semiconductor device.

This embodiment is almost common in the production method of the first embodiment, but a different point is that semiconductor elements are mounted on both faces of the substrate 1. Each semiconductor element 4 on one face is a sensor IC, and each semiconductor element 31 on another face is a peripheral circuit IC. By mounting semiconductor elements on both faces of the substrate 1, as illustrated in FIG. 3B, molding structure is different from that of the first embodiment. Transfer molding is performed by mold clamping with a lower molding 32 which has the almost same form as an upper molding 10. The release film 12 is made to fasten on cavities of both faces of the upper molding and lower molding. Others are the same as the first embodiment. It was confirmed that the semiconductor devices obtained by this embodiment are inexpensive and have good quality.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-115616, filed Apr. 25, 2007, which is hereby incorporated by reference herein in its entirety.

What is claimed is:

1. A method of manufacturing a semiconductor device comprising steps of:

inserting, between upper and lower moldings disposed opposite to each other, a set of semiconductor devices each of which includes a plurality of semiconductor elements fixedly mounted along vertical columns and horizontal rows on a surface of a substrate having a wiring pattern electrically connected to a wiring portion formed in a through hole formed on the substrate, such that an electrode of each semiconductor element is electrically connected to the wiring pattern;

injecting a resin in a cavity between the upper and lower moldings holding the semiconductor elements, and curing the resin;

separating, from the upper and lower moldings, the set of semiconductor devices sealed within the resin;

cutting the substrate along the through hole, to be separated into each of the semiconductor devices, wherein the through hole has, on the surface of the substrate, a through hole land of a width of 0.02 mm or more electrically connected to the wiring portion, and at least one of the upper and lower moldings has a convex portion pressing the through hole at an area extending over a width of the through hole land, so that the resin does not flow into the through hole during the injecting of the resin.

2. A method according to claim 1, wherein a plurality of cavities between the upper and lower moldings are arranged along a plurality of columns, and cavities along one of the plurality of columns correspond to semiconductor elements of the plurality of semiconductor elements.

3. A method according to claim 2, wherein the cavities are arranged so that the cavities along the one of the plurality of columns contact with each other and have a gate at a contact portion, and the resin is injected through the gate into each of the cavities successively.

4. A method according to claim 1, wherein a release film is inserted into a cavity plane of at least one of the upper and lower moldings so that the molding or moldings into which the release film is inserted presses the through hole through the release film.

* * * * *